United States Patent
Fries

(10) Patent No.: US 7,667,199 B2
(45) Date of Patent: Feb. 23, 2010

(54) SYSTEM AND METHOD FOR ASCRIBING TIMES TO EVENTS IN A MEDICAL IMAGING SYSTEM

(75) Inventor: Mark David Fries, Williams Bay, WI (US)

(73) Assignee: General Electric Company, Schnectady, NY (US)

( * ) Notice: Subject to any disclaimer, the term of this patent is extended or adjusted under 35 U.S.C. 154(b) by 805 days.

(21) Appl. No.: 11/284,550

(22) Filed: Nov. 22, 2005

(65) Prior Publication Data

US 2007/0116168 A1    May 24, 2007

(51) Int. Cl.
| | |
|---|---|
| G01T 1/00 | (2006.01) |
| G06F 15/00 | (2006.01) |
| G01J 1/00 | (2006.01) |
| G01T 1/164 | (2006.01) |

(52) U.S. Cl. .............................. 250/336.1; 250/363.03; 712/15

(58) Field of Classification Search .............. 250/336.1, 250/363.03; 712/15
See application file for complete search history.

(56) References Cited

U.S. PATENT DOCUMENTS

| | | | |
|---|---|---|---|
| 6,593,575 B2 | 7/2003 | Fries | |
| 2003/0201838 A1* | 10/2003 | Tam et al. ...................... | 331/74 |
| 2004/0139276 A1* | 7/2004 | Srinivasan et al. .......... | 711/108 |
| 2006/0187226 A1* | 8/2006 | Bruno et al. ................ | 345/534 |

* cited by examiner

Primary Examiner—David P Porta
Assistant Examiner—Carolyn Igyarto
(74) Attorney, Agent, or Firm—Dean D. Small; Small Patent Law Group

(57) ABSTRACT

A timing circuit for implementation in a medical imaging system such as a PET scanner, and a method of ascribing times to events in such systems, is disclosed. In one embodiment, the timing circuit includes an n-phase clock having n frequencies of operation, wherein the clock is selectable to provide n-signals that each vary at n frequencies, an n-phase counter including n counter elements coupled to the clock, an n-phase status detection circuit including n status circuits coupled to the n-phase clock, and an n-phase output circuit including n-registers coupled to the n-phase clock and respectively coupled to the n-phase counter and to n-phase status detection circuit, wherein n-registers respectively receive the n-clock signals, the n-count signals, and the n-status signals, respectively, and in response respectively provide n-output signals that collectively form an output signal indicative of a time at which the event detection signal experienced the first status change.

24 Claims, 6 Drawing Sheets

SYSTEM AND METHOD FOR ASCRIBING TIMES TO EVENTS IN A MEDICAL IMAGING SYSTEM

BACKGROUND OF THE INVENTION

This invention relates generally to medical imaging systems, and more particularly, to image reconstruction using Positron Emission Tomography (PET).

Positrons are positively charged electrons which are emitted by radionuclides that have been prepared using a cyclotron or other device. These are employed as radioactive tracers called "radiopharmaceuticals" by incorporating them into substances, such as glucose or carbon dioxide. The radiopharmaceuticals are injected in the patient and become involved in such processes as blood flow, fatty acid, glucose metabolism, and protein synthesis. As the radionuclides decay, they emit positrons. The positrons travel a very short distance before they encounter an electron, and when this occurs, they are annihilated and converted into two photons, or gamma rays. This annihilation is characterized by two features which are pertinent to PET scanners—each gamma ray has an energy of 511 keV and the two gamma rays are directed in nearly opposite directions. An image is created by determining the number of such annihilations at each location within the field of view.

At least one known PET scanner is cylindrical and includes a detector ring assembly composed of rings of detectors which encircle the patient and which convert the energy of each 511 keV photon into a flash of light that is sensed by a photomultiplier tube (PMT). Coincidence detection circuits connect to the detectors and record only those photons which are detected approximately simultaneously by detectors located on opposite sides of the patient. The number of such simultaneous events, i.e. coincidence events, indicates the number of positron annihilations that occur along a line joining the two opposing detectors. During an acquisition, coincidence events are recorded to indicate the number of annihilations along lines joining pairs of detectors in the detector ring. These numbers are employed to reconstruct an image using well-known computed tomography techniques.

In order to accurately determine coincidence events and thereby obtain useful information for producing images, PET scanners utilize timing circuits to accurately identify and log the times at which photons are received at the detectors of the scanners. These timing circuits, which are often referred to as event locator circuits, typically include digital counters that count time periods based upon a digital clock, and digital counter latches that receive both the count signals from the counters and impulse signals from the detectors of the PET scanner whenever photons are detected. Based upon the count signals, the counter latches effectively time-stamp the impulse signals with times indicative of when the impulse signals are received, and output this information for use by the PET scanner in determining coincidence events.

More specifically, at least one PET scanner includes a digital timing circuit to perform Time-to-Digital Conversion (TDC) at a resolution of 1.302-nS. This known timing circuit includes a quadrature clock in which the frequency of the quadrature clock is fixed at 192-MHz and the quantity of phases of the TDC clock is fixed at four phases. During operation, the digital input to the TDC is driven by an analog comparator and may include very short pulses caused by noise in the comparator input.

To facilitate rejecting the short pulses caused by noise in the comparator input, the known digital timing circuit includes a circuit configured to reject pulses that were deemed to be too short in duration, i.e. less than 20 nanoseconds (nS) in duration. The timing circuit utilizes a 40-MHz clock, with a 25 nS period, through a 5-tap analog delay line, wherein each tap is set to 2.5 nS. Additionally, the timing circuit includes a counter running at 40-MHz to count the number of cycles that the pulse is active to determine the pulse width. However, a timing circuit that has a fixed resolution is may not be easily adapted to generate a desired resolution.

SUMMARY OF INVENTION

In one aspect, a method of operating an imaging system that includes a field programmable gate array is provided. The method includes programming the field programmable gate array to include an n-phase clock having n frequencies of operation, wherein the clock is selectable to provide n-signals that each vary at n frequencies, an n-phase counter including n counter elements coupled to the clock, wherein each respective counter element receives a respective clock signal and in response provides at least a first count signal that varies at the primary frequency, and wherein the second counter element receives a second clock signal, and in response provides a second count signal, an n-phase status detection circuit including n status circuits coupled to the n-phase clock, wherein at least a first status circuit receives the first clock signal and an event detection signal and in response provides a first status signal indicative of whether the event detection signal has experienced a first status change, and wherein the second status circuit receives the second clock signal and the event detection signal and in response provides a second status signal indicative of whether the event detection signal has experienced the first status change, and an n-phase output circuit including n-registers coupled to the n-phase clock and respectively coupled to the n-phase counter and to n-phase status detection circuit, wherein n-registers respectively receive the n-clock signals, the n-count signals, and the n-status signals, respectively, and in response respectively provide n-output signals that collectively form an overall output signal indicative of a time at which the event detection signal experienced the first status change.

In another aspect, a timing circuit for a medical imaging system is provided. The timing circuit includes an n-phase clock having n frequencies of operation, wherein the clock is selectable to provide n-signals that each vary at n frequencies, an n-phase counter including n counter elements coupled to the clock, wherein each respective counter element receives a respective clock signal and in response provides at least a first count signal that varies at the primary frequency, and wherein the second counter element receives a second clock signal, and in response provides a second count signal, an n-phase status detection circuit including n status circuits coupled to the n-phase clock, wherein at least a first status circuit receives the first clock signal and an event detection signal and in response provides a first status signal indicative of whether the event detection signal has experienced a first status change, and wherein the second status circuit receives the second clock signal and the event detection signal and in response provides a second status signal indicative of whether the event detection signal has experienced the first status change, and an n-phase output circuit including n-registers coupled to the n-phase clock and respectively coupled to the n-phase counter and to n-phase status detection circuit, wherein n-registers respectively receive the n-clock signals, the n-count signals, and the n-status signals, respectively, and in response respectively provide n-output signals that collectively form an overall output signal indicative of a time at which the event detection signal experienced the first status change.

In a further aspect, an imaging system is provided. The imaging system includes a plurality of detectors supported by a gantry, a plurality of acquisition circuits coupled to the detectors, wherein the acquisition circuits provide event detection signals, and a field programmable gate array utilized to record the event detection signals, said field programmable gate array programmed to include an n-phase clock having n frequencies of operation, wherein the clock is selectable to provide n-signals that each vary at n frequencies, an n-phase counter including n counter elements coupled to the clock, wherein each respective counter element receives a respective clock signal and in response provides at least a first count signal that varies at the primary frequency, and wherein the second counter element receives a second clock signal, and in response provides a second count signal, an n-phase status detection circuit including n status circuits coupled to the n-phase clock, wherein at least a first status circuit receives the first clock signal and an event detection signal and in response provides a first status signal indicative of whether the event detection signal has experienced a first status change, and wherein the second status circuit receives the second clock signal and the event detection signal and in response provides a second status signal indicative of whether the event detection signal has experienced the first status change, and an n-phase output circuit including n-registers coupled to the n-phase clock and respectively coupled to the n-phase counter and to n-phase status detection circuit, wherein n-registers respectively receive the n-clock signals, the n-count signals, and the n-status signals, respectively, and in response respectively provide n-output signals that collectively form an overall output signal indicative of a time at which the event detection signal experienced the first status change.

DETAILED DESCRIPTION

Figure 1:
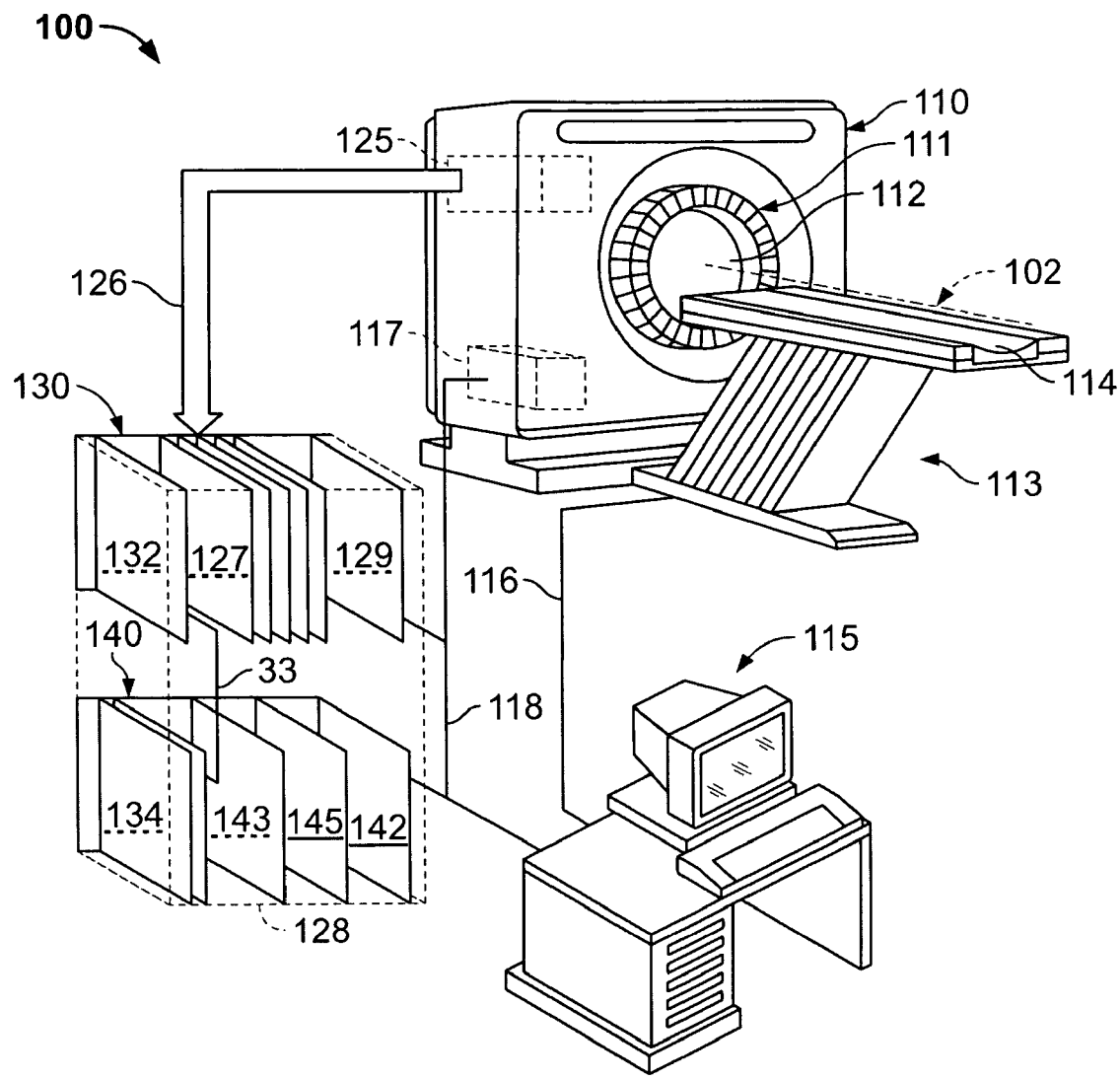
FIG. 1 is a pictorial view with parts cut away of an exemplary medical imaging system.
Figure 3:
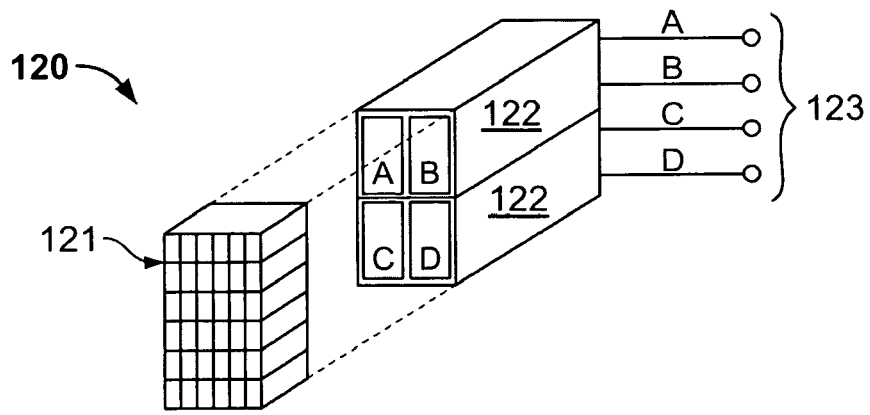
FIG. 3 is a pictorial view of a detector which forms part of the PET scanner shown in FIG. 1.
Figure 2:
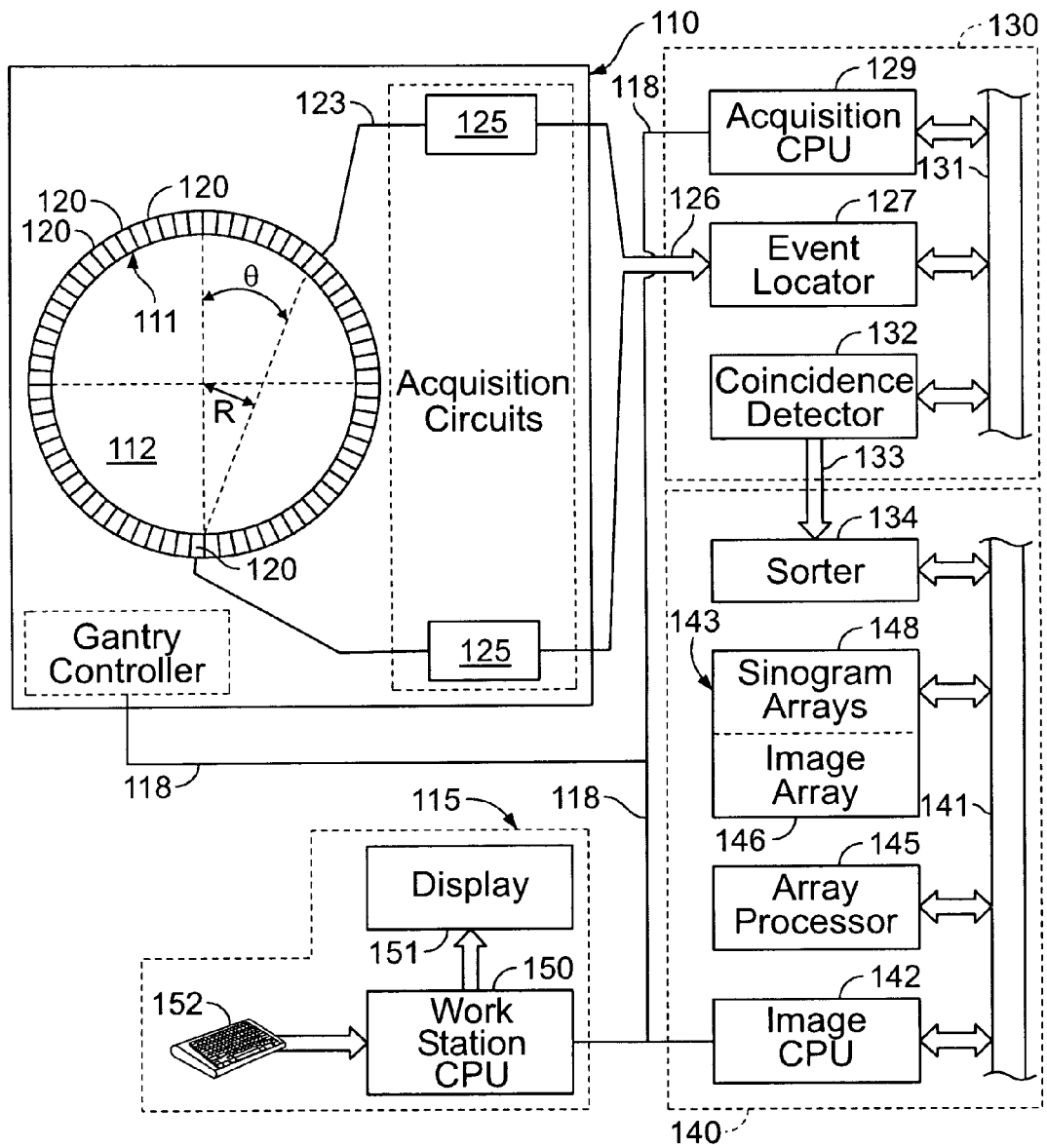
FIG. 2 is a schematic diagram of the PET scanner shown in FIG. 1.

FIG. 1 is a pictorial view with parts cut away of an exemplary imaging system. FIG. 2 is a schematic diagram of the PET scanner shown in FIG. 1. FIG. 3 is a pictorial view of a detector which forms part of the PET scanner shown in FIG. 2.

PET scanner 100 is intended to be representative of a variety of different types of imaging systems in which accurate timing circuitry is employed including, but not limited to, Nuclear Magnetic Resonance (NMR) imaging systems and Computed Tomography (CT) imaging systems. The PET scanner 100 includes a gantry 110 which supports a detector ring assembly 111 about a central opening, or bore 112. The detector ring assembly 111 is circular in shape, and is made up of multiple detector rings (not shown) that are spaced along a central axis 102 to form a cylindrical detector ring assembly. A patient table 113 is positioned in front of the gantry 110 and is aligned with the central axis 102 of the detector ring assembly 111. A patient table controller (not shown) moves the table bed 114 into the bore 112 in response to commands received from an operator work station 115 through a serial communications link 116. A gantry controller 117 is mounted within the gantry 110 and is responsive to commands received from the operator work station 115 through a local area network 118 to operate the gantry 110.

As shown in FIGS. 1-3, each detector ring of the detector ring assembly 111 includes a plurality of detectors 120 wherein each detector 120 includes a scintillator or BGO crystal 121. Each BGO crystal 121 is disposed in front of a photomultiplier tube (PMT) 122. More than one BGO crystal 121 may be disposed in front of a given PMT 122. For example, in one embodiment (shown in FIG. 3) a matrix of thirty-six BGO crystals 121 is disposed in front of four PMTs 122, such that nine BGO crystals are disposed in front of each of the PMTs. All of the PMTs 122 produce analog signals on line 123 when a scintillation event occurs at one of the respective nine BGO crystals 121 that are disposed in front of the PMTs (i.e., when a photon is received by one of the BGO crystals 121). A set of acquisition circuits 125 is mounted within the gantry 110 to receive these signals and produce digital signals indicating the event coordinates (x,y) and the total energy. The digital signals are sent through a cable 126 to an event locator circuit 127 housed in a cabinet 128. Each acquisition circuit 125 also produces an event detection signal that includes event detection pulses (EDPs) when scintillation events took place.

Referring particularly to FIGS. 1 and 2, the event locator circuits 127 form part of a data acquisition processor 130 which periodically samples the signals produced by the acquisition circuits 125. The processor 130 has an acquisition CPU 129 which controls communications on the local area network 118 and a backplane bus 131. The event locator circuits 127 assemble the information regarding each valid event into a set of digital numbers that indicate precisely when the event took place and the position of the detector 120/crystal 121 which detected the event. This event data packet is conveyed to a coincidence detector 132 which is also part of the data acquisition processor 130.

The coincidence detector 132 accepts the event data packets from the event locators 127 and determines if any two of them are in coincidence. Coincidence is determined by a number of factors. First, the time markers in each event data packet must be within a certain time amount of each other, and second, the locations indicated by the two event data packets must lie on a straight line which passes through the field of view (FOV) in the scanner bore 12. Events which cannot be paired are discarded, but coincident event pairs are located and recorded as a coincidence data packet that is conveyed through a serial link 133 to a sorter 134. For a detailed description of the coincidence detector 132, reference is made to U.S. Pat. No. 5,241,181 entitled "Coincidence Detector For A PET Scanner" which is incorporated herein by reference.

The sorter 134 forms part of an image reconstruction processor 140. The sorter 134 counts all events occurring along each projection ray and organizes them into a two dimensional sinogram array 148 which is stored in a memory module 143. The image reconstruction processor 140 also includes an image CPU 142 that controls a backplane bus 141 and links it to the local area network 118. An array processor 145 also connects to the backplane bus 141 and it reconstructs images from the sinogram arrays 148. The resulting image array 146 is stored in memory module 143 and is output by the image CPU 142 to the operator work station 115. For a detailed description of the sorter 134, reference is made to U.S. Pat. No. 5,272,343 entitled "Sorter For Coincidence timing Calibration In A PET Scanner" which is incorporated herein by reference.

The operator work station 115 includes a CPU 150, a CRT display 151 and a keyboard 152. The CPU 150 connects to the local area network 118 and it scans the keyboard 152 for input information. Through the keyboard 152 and associated control panel switches, the operator can control the calibration of the PET scanner, its configuration, and the positioning of the patient table for a scan. Similarly, the operator can control the display of the resulting image on the CRT display 151 and perform image enhancement functions using programs executed by the work station CPU 150.

Figure 4A:
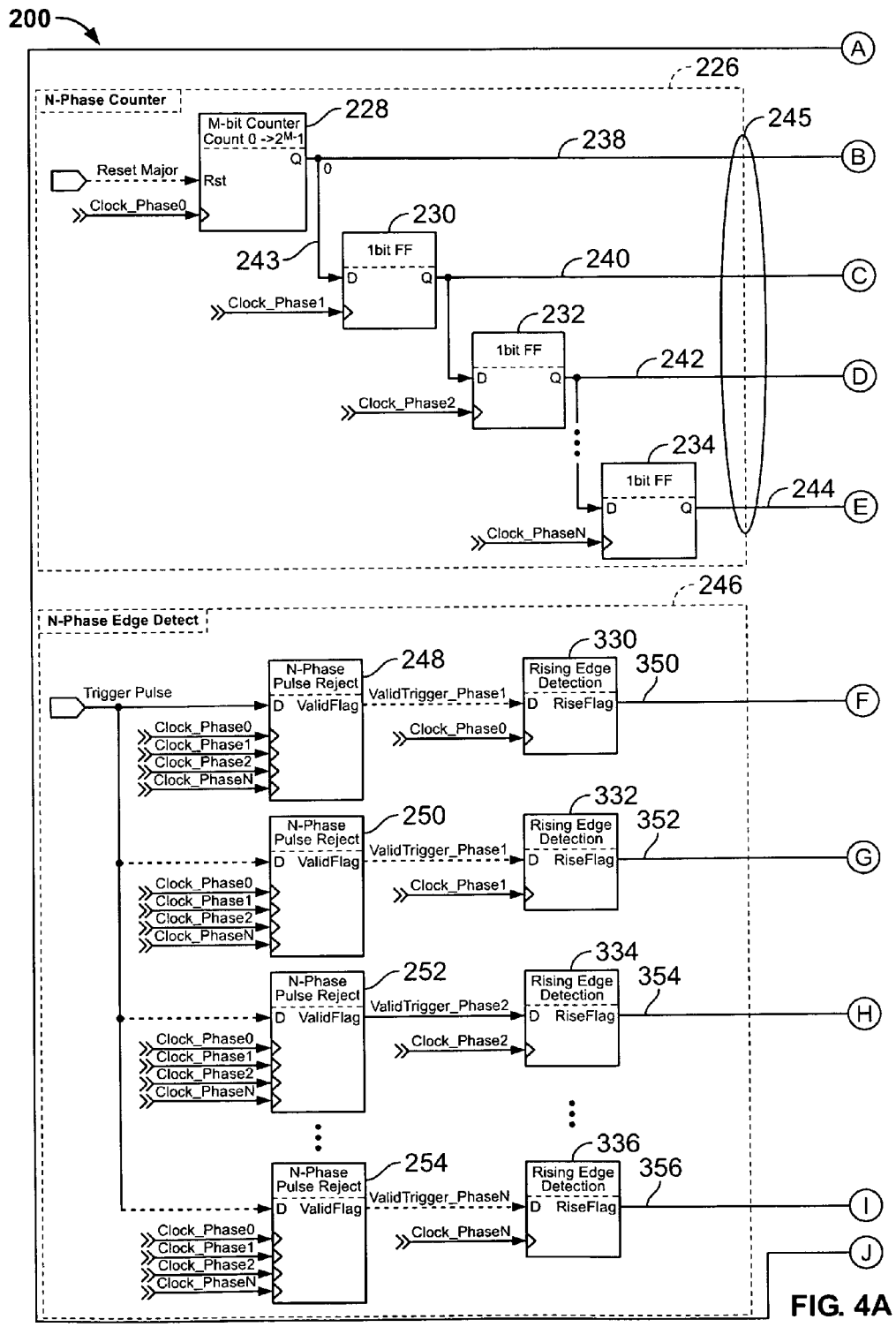
FIG. 4 is a schematic diagram of an exemplary timing circuit that can be utilized in an imaging system such as the PET scanner shown in FIG. 1.
Figure 4B:
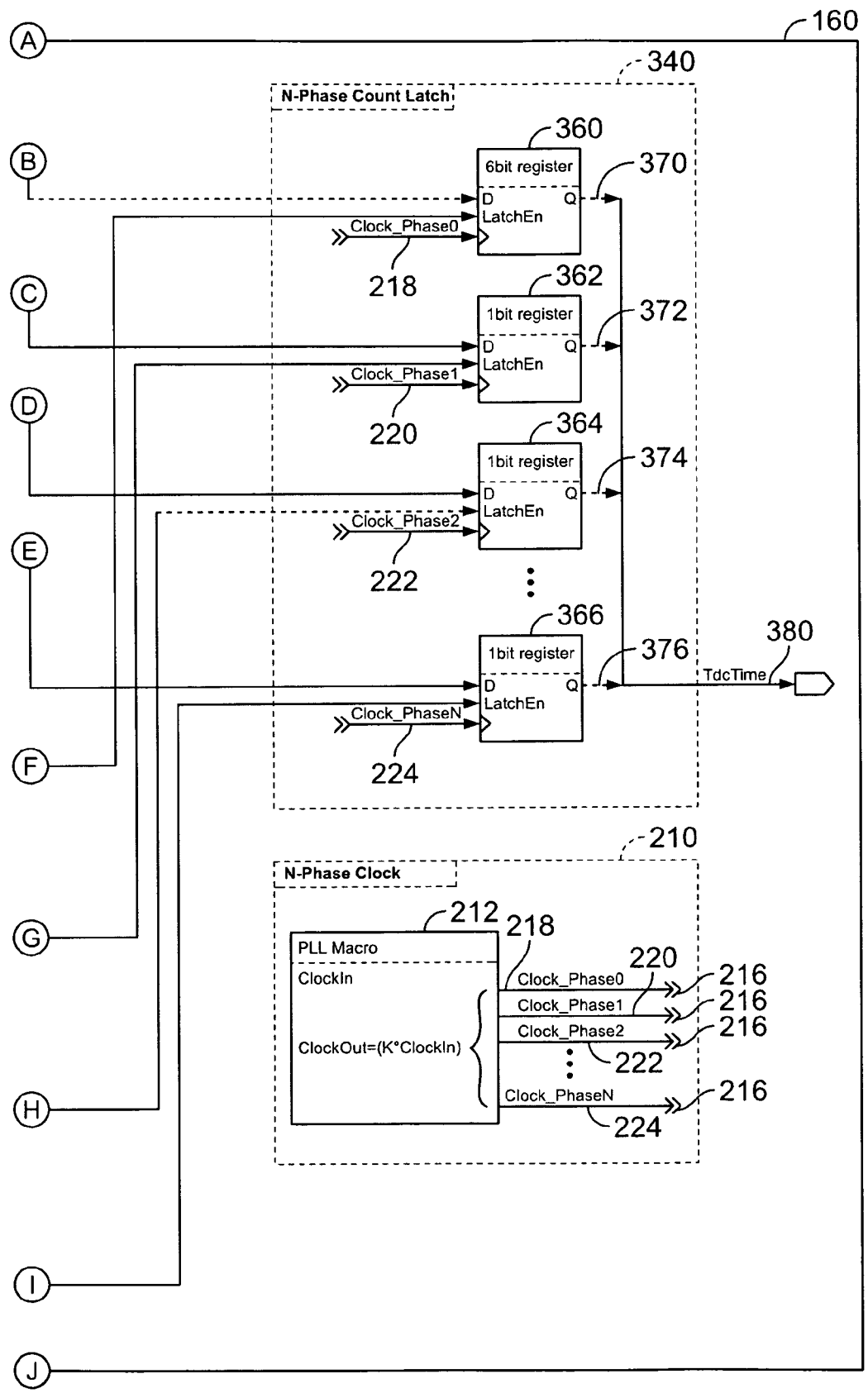

FIG. 4 is an exemplary embodiment of a timing circuit 200 for ascribing times to detected events in an imaging system such as the PET scanner 100 discussed above or other medical imaging systems. In the exemplary embodiment timing circuit 200 includes an n-clock 210, an n-phase counter 226, an n-phase edge detection circuit 246 or status detection circuit 246, and an n-phase latch circuit 340 or output circuit 340. Each of these circuits 210, 226, 246 and 340 can be implemented on a field programmable gate array microcircuit or other electronic device as part of a respective event location circuit 127. Typically, several of the timing circuits 200 are implemented on a single field programmable gate array 160.

The n-phase clock 210 includes a phase locked loop (PLL) circuit 212 that is capable of providing clock signals at a plurality of frequencies. More specifically, n-phase clock 210 is configurable and/or reprogrammable by the operator such that the period of the n-phase clock 210 can be changed to a wide variety of frequencies while operating imaging system 100 to facilitate improving and/or increasing the imaging resolution.

The phase locked loop circuit 212 is reconfigurable to generate n/2, variable-frequency clocks, within the programmable gate array 160, where n is limited only by the number of clocks that the PLL can generate. Each clock generated is set by the PLL to be 360/N degrees out of phase with it nearest neighbor clock. For example, as shown in FIG. 4, PLL circuit 212 is shown as generating four clocks 216 wherein each clock is ninety degrees out of phases with its nearest neighbor clock. As a further example, if N is set by the operator to equal eight, i.e. N=8, PLL 212 will generate eight clocks 216 wherein each clock is forty-five degrees out of phase with its nearest neighbor clock. During operation, both edges of this multi-phase clock are utilized during time stamping, thereby creating a N-phase clock. Given that each phase of the clock operates at F-MHz, the PLL macro has generated a clock that operates at (F*N)-MHz.

The n-phase clock signals are in turn provided to the n-phase counter 226. As shown, the n-phase counter 226 includes an m-bit binary counter 228, and n-bit counters. Although, the exemplary embodiment, illustrates three counters 230, 232, and 234 it should be realized that in the exemplary embodiment, n-phase counter 226 is configurable to include n-bit counters. For example, if PLL 212 is programmed to generate n=12 clocks, n-phase counter 226 will also be programmed to include n=12 bit counters. The n-bit counter 228 can be a binary counter of any type known in the art, while the single-bit counters 230-234 are each shown to be single-bit D-flipflops. Specifically, a first clock signal 218 is provided as the clock input to the binary counter 228 along with a reset input, which allows the output of the binary counter to be reset. The binary counter 228 in turn outputs an n-bit binary count signal 238, which has a lowest significant bit (LSB) 243 that varies at the frequency of the clock signal 218.

The lowest bit 243 of the binary count signal 238 is provided as the D input of the counter 230, which receives also the second clock signal 220 as its clock input. In response, the counter 230 outputs a single-bit count signal 240, which in turn is provided to the next counter 232 as its D input. The counter 232 additionally receives the third clock signal 222 as its clock input and in response provides an additional single-bit count signal 242. The count signal 242 in turn is provided as the D input of the nth counter 234, which receives the nth clock signal 224 as its clock input and in response provides an nth count signal 244.

During operation, the n-phase counter 226 generates a counter that is utilized as the time-stamp for the rising edge of the digital pulse. More specifically, the n-phase counter 226 includes an M-bit binary counter, running on the 0-phase of the N-Phase Clock component wherein the least significant bit of the M-bit counter is shifted through each of the remaining phases of the N-Phase Clock. The combination of all bits creates a counter, which counts at a rate of (F*N)-MHz, with a period of $(1*10^9)/(F*N)$ nanosecond (nS). The number of bits in the counter (M) is determined by the desired maximum dynamic range of the TDC. In the exemplary embodiment, the number of bits is set log 2 (dynamic range/(4*Least signficant bit LSB)). For example, a 4-phase, 200-MHz clock would produce a counter in which the LSB changes every 1.25-nS. If a dynamic range of 250-ns is desired, then M is set to log 2 (250/(4*1.25)), or 6 bits.

Further referring to FIG. 4, timing circuit 200 includes an n-edge detection circuit 246 that includes n pulse reject filters. In the exemplary embodiment, n-edge detection circuit 246 includes four pulse reject filters 248, 250, 252 and 254, respectively, that are respectively coupled to and clocked by the clock signals 218, 220, 222 and 224. Although only four clock signals are illustrated, 218, 220, 222, and 224 as input into each respective filter 248, 250, 250, 252, it should be realized that n-phase clock 210 is capable of generating n clock signals that may each be input into each respective filter 248, 250, 250, 252.

Figure 5:
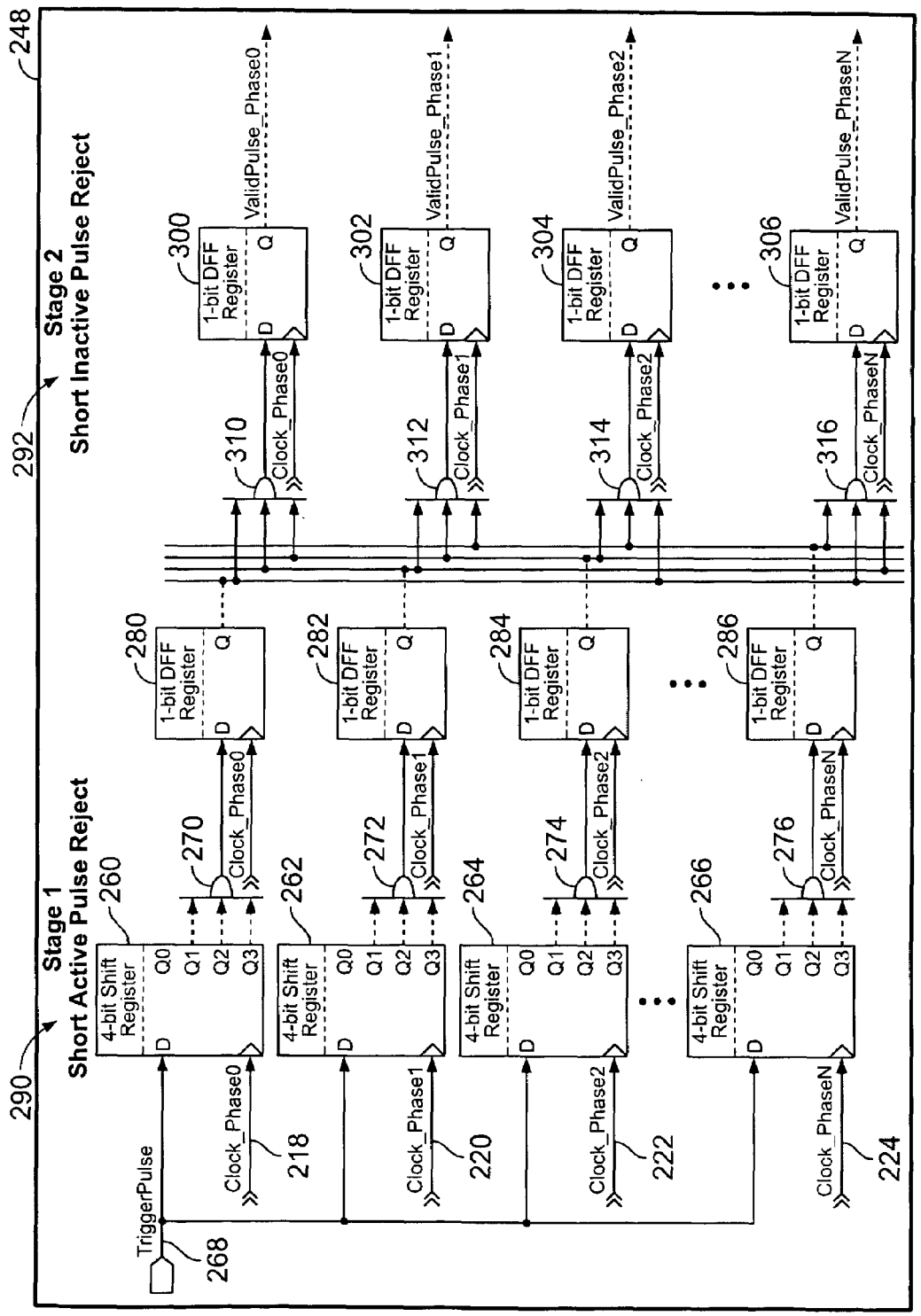
FIG. 5 is a portion of the schematic diagram of the exemplary timing circuit shown in FIG. 4.

FIG. 5 is a schematic illustration of pulse reject filter 248 that is substantially similar to pulse reject filters 250, 252, and 254 shown in FIG. 4. Accordingly, each pulse reject filter 248, 250, 252, 254 . . . n, includes n shift registers 260, 262, 264, and 266 . . . n, which in the exemplary embodiment, are conventional shift registers such as D flip-flop type shift registers in which an output of the shift register (or stored value of the shift register) is set equal to an input value upon receiving a clock pulse, e.g., a rising edge of a clock signal provided to the shift register. In the exemplary embodiment, each of the shift registers 260-266 are four-bit shift registers having four outputs Q0, Q1, Q2 and Q3, and the D input of each of the shift registers 260-266 is coupled to an event detection signal 268 provided from one of the acquisition circuits 125 of the PET scanner 100. In the present embodiment, the event detection signal 2 is a digital signal that changes from a low level to high level (e.g., experiences a rising edge) whenever an event is detected, although in alternate embodiments other types of signals can be provided as the event detection signal.

Each pulse reject filter 248, 250, 252, 254 . . . n also includes n AND gates 270, 272, 274, 276 . . . n that are respectively coupled to the n shift registers 260, 262, 264, 266 . . . n. In the embodiment shown, a first input of each of the AND gates 270-276 is coupled directly to the Q1 output of its respective shift register 260-266, while a second input of each of the AND gates is directly coupled to the Q2 output of its respective shift register, and a third input of each of the AND gates is directly coupled to the Q3 output of its respective shift register. As their output signals, the AND gates 270-276 ... n provide respective edge detection signals which are each input into a respective register 280, 282, 284, 286 ... n.

More specifically, each pulse reject filter 248, 250, 252, 254 ... n includes a short active pulse reject stage 290 and a short inactive pulse reject stage 292. In the exemplary embodiment, short active pulse reject stage 290 includes a series of n (one for each phase of the clock) shift registers 260, 262, 264, 266 ... n, each having a depth of K-bits. Each shift register 260, 262, 264, 266 ... n is clocked with one of the phases of the n-phase clock component. During operation, the (K−1) most significant bits of each shift register are logically AND'd together utilizing AND gates 270, 272, 274, 276 ... n to form a pulse that is active when the input is active for (K−1) or more n-phase clock cycles, and pulses that are shorter than (K−1) clock cycles are rejected. Accordingly, each shift register 280, 282, 284, 286 ... n generates an output that acts as a valid flag, when the input pulse is active for more than (K−1) times the period of one clock phase, for each phase of the N-phase clock.

As shown in FIG. 5 the outputs from each shift register 280, 282, 284, 286 ... n are utilized by the short inactive pulse reject stage 292. The short inactive pulse reject stage 292 includes a series of n shift registers 300, 302, 304, 306 ... n, each with a depth of 3-bits. Each shift register is clocked with one of the phases of the n-phase clock component. More specifically, the valid flag provided from the short active pulse reject component 290 is provided an input to a respective AND gate 310, 312, 314, 316 ... n within the short inactive pulse reject stage 292. The output for each respective AND gate 310, 312, 314, 316 ... n are logically AND'd outputs of the previous stage, i.e. shift register 280, 282, 284, 286 ... n, and the those of the next two clock phases. In operation, the AND'ing operation effectively looks for short dropouts in the valid flag from the short active pulse reject stage 290 component and rejects short inactive pulses, and delivers a valid trigger signal to a respective shift register 300, 302, 304, 306 ... n.

In the exemplary embodiment, shift registers 300, 302, 304, 306 ... n are the are conventional shift registers such as D flip-flop type shift registers in which an output of the shift register (or stored value of the shift register) is set equal to an input value upon receiving a clock pulse, e.g., a rising edge of a clock signal provided to the shift register. In the exemplary embodiment, each shift register has an output Q that is indicative of a valid pulse being received within n-phase edge detection circuit 246 that is transmitted to shift registers 330, 332, 334, 336 ... n wherein a signal indicative of a rising edge of the incoming signal being true is transmitted to n-phase count latch 340.

Figure 6:
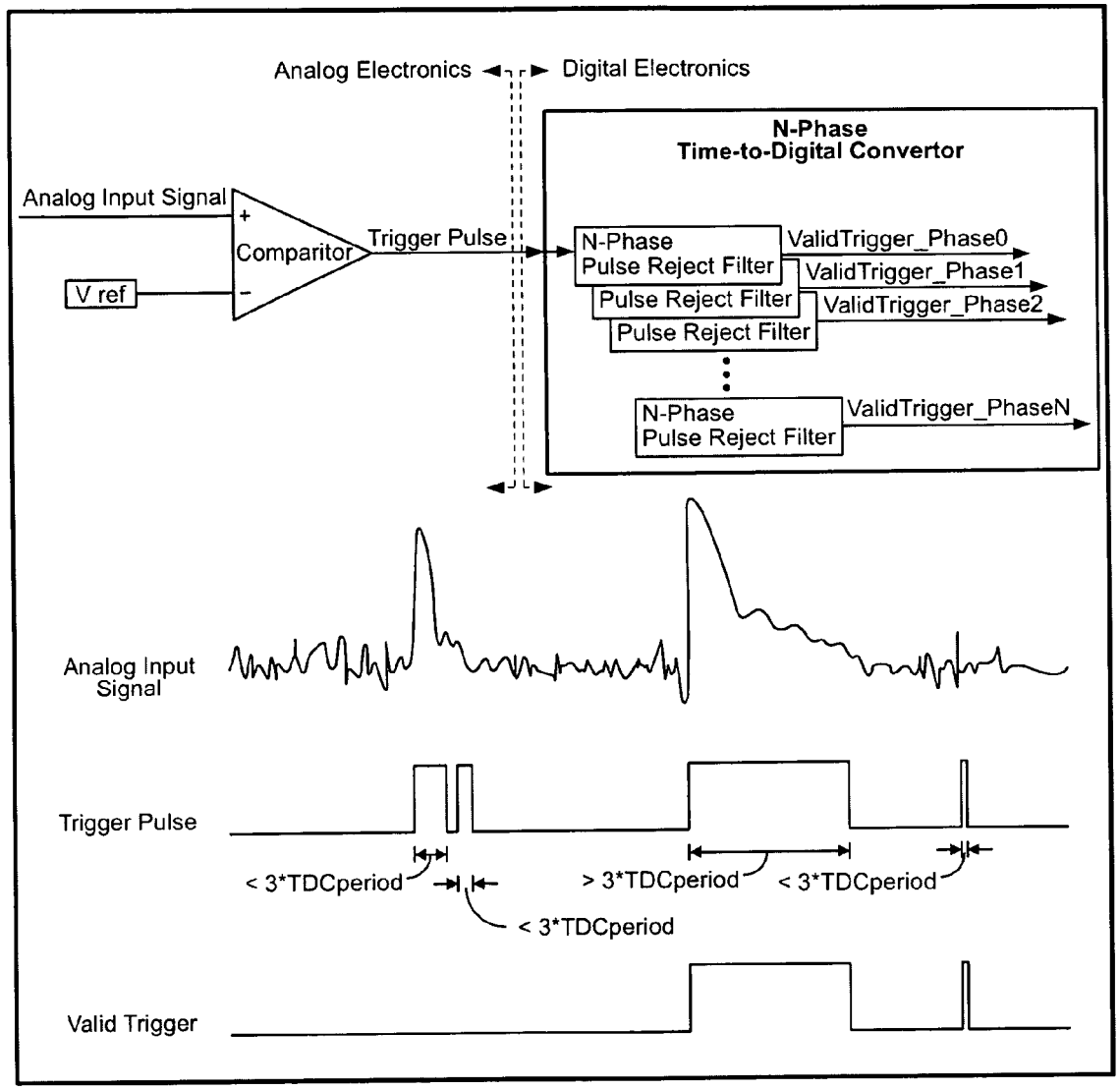
FIG. 6 is an operational schematic of the timing circuit shown in FIG. 4.

More specifically, and referring to FIG. 6, during operation the n-phase edge detection portion 246 analyzes the analog input signal from the imaging system. The short active pulse section 290 is programmed to reject pulses that are shorter than (K−1) clock cycles, i.e. <Tfilter. However, if the pulse is >Tfilter a signal is transmitted, i.e. a valid flag, when the input pulse is active for more than (K−1) times the period of one clock phase, for each phase of the N-phase clock.

As stated previously, n edge detection signals 350, 352, 354, 356 ... n are respectively provided to n additional output registers 360, 362, 364, 366 ... n, respectively, which make up the n-count latch circuit 340. Each of the output registers 360, 362, 364, 366 ... n in the exemplary embodiment is a D flip-flop type of register, although other types of registers can be used in alternate embodiments. The first output register 360 is a 6-bit register that receives as its clock input the first clock signal 218, and receives as its input signal the 6-bit binary count signal 238. Additionally, the output register 360 receives a latch enable signal that is the first edge detection signal 350. For this reason, the first edge detection signal 350 (as well as the other edge detection signals) can be understood to be a latch signal. The first output register 360 operates by storing the current value of the binary count signal 238 whenever a rising edge of the first clock signal 218 is provided, so long as the value of the first edge detection signal 350 at the time of the rising edge is at a high level. The output register 360 in turn provides as an output signal 370 the 6-bit value that is currently being stored by the register 360.

The remaining output registers 362, 364, 366 ... n are single-bit registers that are respectively provided with the count signals 240, 242, 244 ... n as inputs. However, except in terms of the number of bits stored in the registers 362, 364, 366 ... n, the registers operate similarly to the 6-bit register 360 in that each register is clocked by a respective one of the clock signals 220, 222, 224 ... n and further receives a respective one of the edge detection signals 352, 354, 356 ... n as a latch enable signal. Each of the single-bit registers 362, 364, 366 ... n stores an updated value of the respective count signals 240, 242, 244 ... n only at such times as rising edges of the respective clock signals 220, 222, 224 ... n occur while the respective edge detection signals 352, 354, 356 ... n are at high levels. Additionally, each of the single-bit registers 360, 362, 364 ... n produces a respective single-bit output signal 372, 374, 376 ... n, which are combined with the 6-bit output signal 370 to produce an overall 9-bit output signal 380.

Described herein is a method and apparatus for time-stamping the rising edge of a digital pulse signal utilizing a synchronous variable-frequency, n-phase counter that is implemented inside a programmable gate array such as a field programmable gate array (FPGA). As such, the apparatus eliminates a plurality analog delay lines that are utilized within at least one known timing circuit. The apparatus utilizes a synchronous counter thus eliminating the need to asynchronously clock counter values. The number of phases in the multi-phase clock is determined by the way the counter is coded in the defining hardware description language (HDL) and the frequency is determined by the parameters to which the Phase-Lock-Loop (PLL) that drives the clock is programmed. The number of phases is set at design time, whereas the frequency is set at run-time.

In the exemplary embodiment, the apparatus includes an n-phase clock that is programmable to generate n/2, variable-frequency clocks, within the programmable gate array, where n is limited only by the number of clocks that the PLL can generate. Each clock generated is set by the PLL to be (360/n)-degrees out of phase with it nearest neighbor clock. Both edges of this multi-phase clock are then utilized during time stamping, thereby creating an n-phase clock. Given that each phase of the clock operates at F-MHz, the PLL has essentially created a clock that operates at (F*N)-MHz.

Moreover, the apparatus includes an n-phase counter that is utilized as the time-stamp for the rising edge of the digital pulse wherein the number of bits in the counter (M) is determined by the desired maximum dynamic range of the TDC and in the exemplary embodiment is set to log 2 (dynamic range/(4*LSB)). For instance, a 4-phase, 200-MHz clock produces a counter in which the LSB changes every 1.25-nS. If a dynamic range of 250-ns is desired, then M is set to log 2 (250/(4*125)), or 6 bits.

The apparatus also includes a short active pulse reject function that is programmed to reject pulses that are shorter than (K−1) clock cycles and to also generate a "valid flag" output, when the input pulse is active for more than (K−1) times the period of one clock phase, for each phase of the N-phase clock. The apparatus also includes a short inactive pulse reject function that is programmable to receive inputs from the short active pulse reject function and to look for short dropouts in the valid flag from the short active pulse reject component and thus, rejects short inactive pulses. The n-phase count latch section then latches each phase of the n-phase counter component based on the pulses generated by the n-phase edge detect component.

The method and apparatus described herein thus facilitates reducing manufacturing costs compared to known imaging systems by implementing the variable clock and other associated components as part of a field programmable gate array (FPGA) that may also be utilized to process incoming gamma-ray photons. Moreover, utilizing a FPGA reduces the board area utilized to form the timing circuit, and eliminates an analog delay line thus providing the timing circuit the ability to time-stamp to any given resolution is a digital logic function and is not adversely affected by temperature or aging. During operation, since only the arriving digital pulse is shifted through a set of registers in the n-phase edge-detect component, only these registers see the asynchronous input and can go meta-stable. The n-phase count latch component synchronously holds the output of the n-phase counter component, and also therefore not become meta-stable. In addition, since the sum of the setup plus hold times of the current programmable gate array is less than the period of the m-phase clock, only one of the four sets of shift registers in the n-phase edge-detect component can become meta-stable.

As a result, the timing circuit described herein includes a variable clock wherein the frequency of the n-phase clock is no longer fixed at 192-MHz. The resolution of the TDC can be adjusted by changing the frequency of the clocks generated by the PLL macro, depending on application need. The maximum speed of each phase of the TDC, and thus the TDC resolution, is only limited by how fast the PLL can be run and the delays within the programmable gate array or ASIC. In addition, with newer families of programmable gate arrays, this adjustment can be made at run-time, by reconfiguring the multiply/divide network within the PLL. Additionally, the number of phases (N) is no longer fixed at four, but rather is only limited by number of phases of a clock that can be generated by the PLL and by the physical area/speed of the programmable gate array or ASIC. Advanced HDL coding techniques can be used to limit the impact of changing the number of phases in the design, by instantiation of the desired number of TDC phases. Further, the length of the shift registers in the reject short valid pulses component is set by design, such that pulse rejection is set to a length of (K) times the period of the n-phase clock. Again, since this length is set by design, the filter length is adjustable and advanced HDL coding techniques can be used to limit the impact of changing the filter length.

While the invention has been described in terms of various specific embodiments, those skilled in the art will recognize that the invention can be practiced with modification within the spirit and scope of the claims.

What is claimed is:

1. A method of operating an imaging system that includes a field programmable gate array comprises:
   implementing on the field programmable gate array:
   an n-phase clock having a frequency of operation, wherein the clock is selectable to provide n-clock signals that each vary at the frequency, wherein n is greater than one;
   an n-phase counter including n counter elements coupled to the clock,
   wherein a first counter element receives a first clock signal and in response provides at least a first count signal that varies at the frequency, and wherein a second counter element receives a second clock signal, and in response provides a second count signal;
   an n-phase status detection circuit including n pulse reject filters, each pulse reject filter coupled to the n-phase clock, wherein each of the pulse reject filters receives the first clock signal and an event detection signal and in response generates a flag indicative of whether the event detection signal is active for a pre-determined time, the flags being used to generate respective n valid event detection signals; and
   an n-phase output circuit including n-registers coupled to the n-phase clock, the n-phase counter and the n-phase status detection circuit, wherein n- registers respectively receive the n-clock signals, the n-count signals, and the n valid event detection signals, and in response respectively provide n-output signals that collectively form an overall output signal indicative of a time at which at least one of the n valid event detection signals is detected.

2. A method in accordance with claim 1 further comprising:
   programming the n-phase output circuit to include n-phase latches that are synchronous to the n-phase clock to facilitate holding the counter information.

3. A method in accordance with claim 2 further comprising derivating a set of n-phase latch enable signals filtered digitally from a single digital input and utilizing the n-phase latch enable signals to synchronously hold the n-phase counter information.

4. A method in accordance with claim 1 further comprising generating n>4 clocks, wherein each clock is 360/n degrees out of phase with it nearest neighbor clock.

5. A method in accordance with claim 1 wherein the n-phase clock includes a re-programmable phase locked loop circuit, said method further comprising reprogramming the phase locked loop circuit to select the frequency of the n-phase clock to modify the Time-to-Digital Conversion (TDC) resolution.

6. A method in accordance with claim 1, wherein the n-phase clock includes a re-programmable phase locked loop circuit, said method further comprising selecting the quantity of clock phases to modify the Time-to-Digital Conversion (TDC) resolution.

7. The method of claim 5 further comprising selecting the TDC resolution during operation based on dynamically changing TDC performance requirements.

8. A timing circuit for a medical imaging system comprising:
   an n-phase clock having a frequency of operation, wherein the clock is selectable to provide n-signals that each vary at the frequency, wherein n is greater than one;
   an n-phase counter including n counter elements coupled to the clock, wherein a first counter element receives a first clock signal and in response provides at least a first count signal that varies at the frequency, and a second counter element receives a second clock signal, and in response provides a second count signal;
   an n-phase status detection circuit including n pulse reject filters, each pulse reject filter being coupled to the n-phase clock, each of the pulse reject filters receives the first clock signal and an event detection signal and in response generates a flag indicative of whether the event detection signal is active for a predetermined time, the flags being used to generate respective n valid event detection signals; and an n-phase output circuit including n-registers coupled to the n-phase clocks, the n-phase counter and to the n-phase status detection circuit, wherein n- registers respectively receive the n-clock signals, the n-count signals, and the n valid event detection signals, and in response respectively provide n-output signals that collectively form an overall output signal indicative of a time at which at least one of the n valid event detection signals is detected.

9. The timing circuit of claim 8, wherein the n-phase output circuit further includes n-phase latches that are synchronous to the n-phase clock to facilitate holding the counter information.

10. The timing circuit of claim 9, wherein the derivation of a set of n-phase latch enable signals filtered digitally from a single digital input are utilized to synchronously hold the n-phase counter information.

11. The timing circuit of claim 8 wherein the n-phase clock is configured to generate n>4 clocks, wherein each clock is 360/n degrees out of phase with it nearest neighbor clock.

12. The timing circuit of claim 8, wherein the n-phase clock includes a re-programmable phase locked loop circuit that is configurable to select the frequency of the n-phase clock to modify the Time-to-Digital Conversion (TDC) resolution.

13. The timing circuit of claim 8, wherein the n-phase clock includes a re-programmable phase locked loop circuit that is configurable to select the quantity of clock phases to modify the Time-to-Digital Conversion (TDC) resolution.

14. The timing circuit of claim 12, wherein the TDC resolution is selected at run-time based on dynamically changing TDC performance requirements.

15. An imaging system comprising:
a plurality of detectors supported by a gantry;
a plurality of acquisition circuits coupled to the detectors, wherein the acquisition circuits provide event detection signals; and
a field programmable gate array utilized to record the event detection signals, said field programmable gate array includes:
an n-phase clock having a frequency of operation, wherein the clock is selectable to provide n-signals that each vary at the frequency, wherein n is greater than one;
an n-phase counter including n counter elements coupled to the clock,
wherein a first counter element receives a first clock signal and in response provides at least a first count signal that varies at the frequency, and wherein a second counter element receives a second clock signal, and in response provides a second count signal;
an n-phase status detection circuit including n pulse reject filters, each pulse reject filter being coupled to the n-phase clock, wherein each of the pulse reject filters receives the first clock signal and an event detection signal and in response generates a flag indicative of whether the event detection signal active for a predetermined time, the flags being used to generate respective n valid event detection signals; and an n-phase output circuit including n-registers coupled to the n-phase clock, the n-phase counter and the n-phase status detection circuit, wherein n- registers respectively receive the n-clock signals, the n-count signals, and the n valid event detection signals, and in response respectively provide n-output signals that collectively form an overall output signal indicative of a time at which at least one of the n valid event detection signals is detected.

16. The imaging system of claim 15, wherein the n-phase output circuit further includes n-phase latches that are synchronous to the n-phase clock to facilitate holding the counter information.

17. The imaging system of claim 16, wherein the derivation of a set of n-phase latch enable signals filtered digitally from a single digital input are utilized to synchronously hold the n-phase counter information.

18. The imaging system of claim 15 wherein the n-phase clock is configured to generate n>4 clocks, wherein each clock is 360/n degrees out of phase with it nearest neighbor clock.

19. The imaging system of claim 15, wherein the n-phase clock includes a re-programmable phase locked loop circuit that is configurable to select the frequency of the n-phase clock to modify the Time-to-Digital Conversion (TDC) resolution.

20. The imaging system of claim 19 wherein said imaging system comprises a CT/PET imaging system, and wherein the TDC resolution is selected at run-time based on dynamically changing TDC performance requirements.

21. The method of claim 1 wherein each n pulse reject filter receives the n-clock signals.

22. The method of claim 1 wherein each n pulse reject filter includes an active pulse reject stage and an inactive pulse reject stage, the active pulse reject stage is coupled to the n-phase clock, the active pulse reject stage receiving the first clock signal and the event detection signal and in response generates the flag indicative of whether the event detection signal is active for the predetermined time.

23. The method of claim 1 wherein each n pulse reject filter includes an active pulse reject stage and an inactive pulse reject stage, each inactive pulse reject stage receiving a input from a respective active pulse reject stage and in response rejecting event detection signals that are active for a time that is less than the predetermined time.

24. The method of claim 1 wherein each n pulse reject filter includes an active pulse reject stage and an inactive pulse reject stage, the inactive pulse reject stages receiving an input from a respective active pulse reject stage and in response generating a valid event detection signal, the valid event detection signal being input to the n-phase output circuit.

* * * * *